(12) United States Patent
Segawa et al.

(10) Patent No.: US 8,465,011 B2
(45) Date of Patent: Jun. 18, 2013

(54) FIXING JIG AND METHOD OF PROCESSING WORK

(75) Inventors: Takeshi Segawa, Saitama (JP); Kiyofumi Tanaka, Kita-Adachi-gun (JP)

(73) Assignees: Lintec Corporation, Tokyo (JP); Shin-Etsu Polymer, Tokyo (JP)

( * ) Notice: Subject to any disclaimer, the term of this patent is extended or adjusted under 35 U.S.C. 154(b) by 579 days.

(21) Appl. No.: 12/452,647

(22) PCT Filed: Jul. 31, 2008

(86) PCT No.: PCT/JP2008/063797
§ 371 (c)(1),
(2), (4) Date: Jan. 13, 2010

(87) PCT Pub. No.: WO2009/020051
PCT Pub. Date: Feb. 12, 2009

(65) Prior Publication Data
US 2010/0164155 A1  Jul. 1, 2010

(30) Foreign Application Priority Data

Aug. 9, 2007  (JP) .................................. 2007-208264

(51) Int. Cl.
*H01L 21/683* (2006.01)
*B25B 11/00* (2006.01)

(52) U.S. Cl.
USPC ................ 269/21; 269/900; 156/707; 29/559

(58) Field of Classification Search
USPC ..................................................... 269/20, 21
IPC ..................................................... H01L 21/683
See application file for complete search history.

(56) References Cited

U.S. PATENT DOCUMENTS 5,009,735 A * 4/1991 Ametani et al. ............... 156/241
5,254,201 A * 10/1993 Konda et al. .................. 156/751

(Continued)

FOREIGN PATENT DOCUMENTS

JP         A-11-16862        1/1999
JP         2006216775 A  *   8/2006

(Continued)

OTHER PUBLICATIONS

Office Action issued in Chinese Patent Application No. 200880100927.5 dated Mar. 24, 2011.

(Continued)

*Primary Examiner* — Lee D Wilson
*Assistant Examiner* — Tyrone V Hall, Jr.
(74) *Attorney, Agent, or Firm* — Oliff & Berridge, PLC

(57) ABSTRACT

A fixing jig is made up of a plate-like jig main body (2) and a close contact layer (3) which detachably holds a work (W) in close contact therewith. The jig main body has: on one surface thereof a plurality of supporting projections (4) to support the close contact layer; and also has, along an outer peripheral portion of said one surface, a side wall (5) which is of substantially the same height as the supporting projections. The close contact layer is adhered to an end surface of the side wall to thereby define a partitioned space (6) between the close contact layer and the jig main body. By sucking the air within the partitioned space via a ventilation hole (7) formed in the jig main body, the close contact layer is deformed. The work is thus surely supported and fixed also in performing a processing in which a force is applied to the work. The jig main body (2) has formed therein a suction hole (8) which opens into an outer surface on the side of the close contact layer (3) but which is not communicated with the partitioned space (6). A through hole (9) in communication with the suction hole (8) is formed in the close contact layer (3). A suction force is applied to the work W by evacuation of the suction hole (8).

2 Claims, 2 Drawing Sheets

U.S. PATENT DOCUMENTS

| | | | | |
|---|---|---|---|---|
| 5,343,012 | A | * | 8/1994 | Hardy et al. .................. 118/725 |
| 5,423,716 | A | * | 6/1995 | Strasbaugh .................. 451/388 |
| 5,602,058 | A | * | 2/1997 | Ooizumi et al. .............. 156/286 |
| 5,624,299 | A | * | 4/1997 | Shendon ......................... 451/28 |
| 6,056,632 | A | * | 5/2000 | Mitchel et al. ................ 451/288 |
| 6,257,564 | B1 | * | 7/2001 | Avneri et al. .................. 269/21 |
| 6,271,503 | B1 | * | 8/2001 | Hall et al. .................. 219/444.1 |
| 6,416,402 | B1 | * | 7/2002 | Moore .......................... 451/60 |
| 6,443,820 | B2 | * | 9/2002 | Kimura ......................... 451/285 |
| 6,503,130 | B2 | * | 1/2003 | Lim .............................. 451/285 |
| 6,716,084 | B2 | * | 4/2004 | Basol et al. ....................... 451/4 |
| 6,787,866 | B2 | * | 9/2004 | Fujii et al. ..................... 257/415 |
| 6,881,135 | B2 | * | 4/2005 | Boo et al. ...................... 451/285 |
| 6,921,323 | B2 | * | 7/2005 | Boo et al. ...................... 451/285 |
| 7,527,271 | B2 | * | 5/2009 | Oh et al. ........................... 279/3 |
| 7,607,647 | B2 | * | 10/2009 | Zhao et al. ...................... 269/21 |
| 7,669,839 | B2 | * | 3/2010 | McClaran ....................... 269/21 |
| 8,182,649 | B2 | * | 5/2012 | Watanabe et al. ............. 156/707 |
| 2004/0038498 | A1 | * | 2/2004 | Ozono et al. .................. 438/464 |
| 2008/0029945 | A1 | * | 2/2008 | Kaiser et al. .................... 269/21 |
| 2008/0213418 | A1 | * | 9/2008 | Tan et al. ...................... 425/112 |
| 2009/0060688 | A1 | * | 3/2009 | Asada .......................... 414/217 |

FOREIGN PATENT DOCUMENTS

| | | |
|---|---|---|
| JP | A-2006-216775 | 8/2006 |
| JP | 2006318984 A * | 11/2006 |
| JP | A-2006-318984 | 11/2006 |
| WO | WO 2005098522 A1 * | 10/2005 |
| WO | WO 2005/109489 A1 | 11/2005 |
| WO | WO 2007105611 A1 * | 9/2007 |

OTHER PUBLICATIONS

Sep. 2, 2008 International Search Report issued in PCT Application No. PCT/JP2008/063797 (with translation).

Sep. 2, 2008 Written Opinion by the International Searching Authority issued in PCT Application No. PCT/JP2008/063797 (with translation).

* cited by examiner

FIXING JIG AND METHOD OF PROCESSING WORK

TECHNICAL FIELD

The present invention relates to a fixing jig which fixes a thin plate-like work such as a semiconductor wafer and the like, and also relates to a method of processing a work by using this fixing jig.

BACKGROUND

Among the steps for manufacturing semiconductors there is a step, in order to miniaturize a semiconductor chip, in which a rear surface of a semiconductor wafer (hereinafter, referred to as a wafer) is ground to thin the wafer (back grinding step). In this back grinding step, a protection sheet made of an adhesive sheet and the like is adhered to the front surface (the surface on which the circuit is formed) of the wafer, thereby protecting the surface. Then, after the back grinding step, there is performed a processing in which the protection sheet is peeled off from the wafer.

The wafer that has been made ultrathin in the back grinding step is likely to be damaged even by the slightest shocks. Therefore, in order to prevent the wafer that has been made ultrathin from being damaged, at the time of transporting or machining, due to distortion by a self weight, acceleration, or processing stresses, there has been proposed a fixing jig which supports and fixes the wafer and which is made up of a plate-like jig main body; and a close contact layer which is provided on one surface of the jig main body and which detachably holds the work in close contact (see, e.g., patent document 1). This jig main body has on one surface a plurality of supporting projections which support thereon the close contact layer and also has, on an outer peripheral portion of said one surface, a side wall of substantially the same height as the supporting projections. The close contact layer is adhered to one end surface of the side wall. Between the close contact layer and the jig main body, there is defined a partitioned space which is enclosed by the side wall. The jig main body has formed therein a ventilation hole which is in communication with the partitioned space.

If the air within the partitioned space is sucked via the ventilation hole by evacuation of the ventilation hole, the close contact layer will be deformed so as to be dented at the position between the respective supporting projections. As a result, the area of contact of the wafer with the close contact layer will decrease. It follows that the wafer can be tumbled from the fixing jig without applying an undue force.
Patent Document 1: JP-A-2006-216775

However, when the processing is performed of peeling a protection sheet off from a wafer on which the protection sheet is adhered, if the above processing is performed the wafer fixed to the above fixing jig, the force to be applied to the wafer at the time of processing is partially strong. Therefore, the wafer will easily be tumbled from the fixing jig. In addition, in case the kind of the close contact layer is changed depending on the processing conditions so that the wafer does not drop, even if the partitioned space is reduced in pressure by evacuation of the ventilation hole, the close contact with the wafer will be so strong that the deformation of the close contact layer hardly takes place. As a result, when the wafer is removed from the fixing jig, undue force will be operated on the wafer and the wafer is likely to be broken.

In view of the above points, this invention has a problem of providing a fixing jig which can surely fix the work in close contact even when the processing of adding a force to the work is performed. This invention has also a problem of providing a method of processing a work by using the fixing jig.

SUMMARY

In order to solve the above problems, the invention of claim 1 of this invention is a fixing jig for fixing a thin plate-like work. The fixing jig comprises: a plate-like jig main body; and a close contact layer which is disposed on one surface of the jig main body and which detachably holds the work in close contact with the jig main body. The jig main body has: a plurality of supporting projections on one surface thereof for supporting the close contact layer; and a side wall of a height which is substantially equal to the supporting projections. The side wall is disposed along an outer peripheral portion of said one surface. The close contact layer is adhered to an end surface of the side wall so as to define, between the close contact layer and the jig main body, a partitioned space enclosed by the side wall. The jig main body has formed therein: a ventilation hole which is in communication with the partitioned space such that the close contact layer is deformed by suction of the air within the partitioned space via the ventilation hole; and a suction hole which opens into an outside surface on a side of the close contact layer but which is free from communication with the partitioned space. The close contact layer has formed therein a through hole which is in communication with the suction hole. The through hole is so constructed and arranged that, by evacuation of the suction hole, a suction force is operated on the work.

Further, in order to solve the above problems, the invention according to claim 2 is a method of processing a work by using the fixing jig according to claim 1. The method comprises the steps of: performing a predetermined processing on the work in a state in which the thin plate-like work is held in close contact with the close contact layer of the fixing jig, and in which the ventilation hole is kept free from evacuation but in which the suction hole is evacuated; and removing the work from the fixing jig by stopping the evacuation of the suction hole and by sucking the air within the partitioned space through evacuation of the ventilation hole so as to deform the close contact layer.

According to this invention, the work is fixed to the fixing jig by the suction force due to evacuation of the suction hole, in addition to the close contact force between the work and the close contact layer, and the fixing force of the work is partially reinforced. Therefore, when the processing is performed in which the force is applied to the work such as in the processing of peeling the protection sheet and the like, the work will not be removed from the fixing jig.

In addition, since the suction force can be obtained, the close contact force of the close contact layer relative to the work need not be made so strong. Therefore, if the air within the partitioned space is sucked by evacuating the ventilation hole, the close contact layer will surely be deformed. It follows that the work can be removed from the fixing jig without applying an undue force thereto, whereby the work can be prevented from being damaged at the time of removing.

Figure 1:
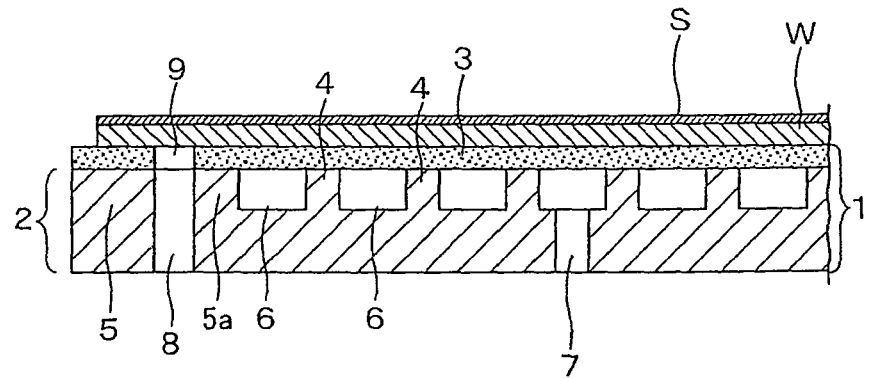
FIG. 1 is a schematic sectional view of a fixing jig according to an embodiment of this invention.

DESCRIPTION OF REFERENCE NUMERALS AND CHARACTERS 1 fixing jig
2 jig main body
3 close contact layer
4 supporting projection
5 side wall
6 partitioned space
7 ventilation hole
8 suction hole
W wafer (work)

DETAILED DESCRIPTION OF THE EMBODIMENTS

Figure 2:
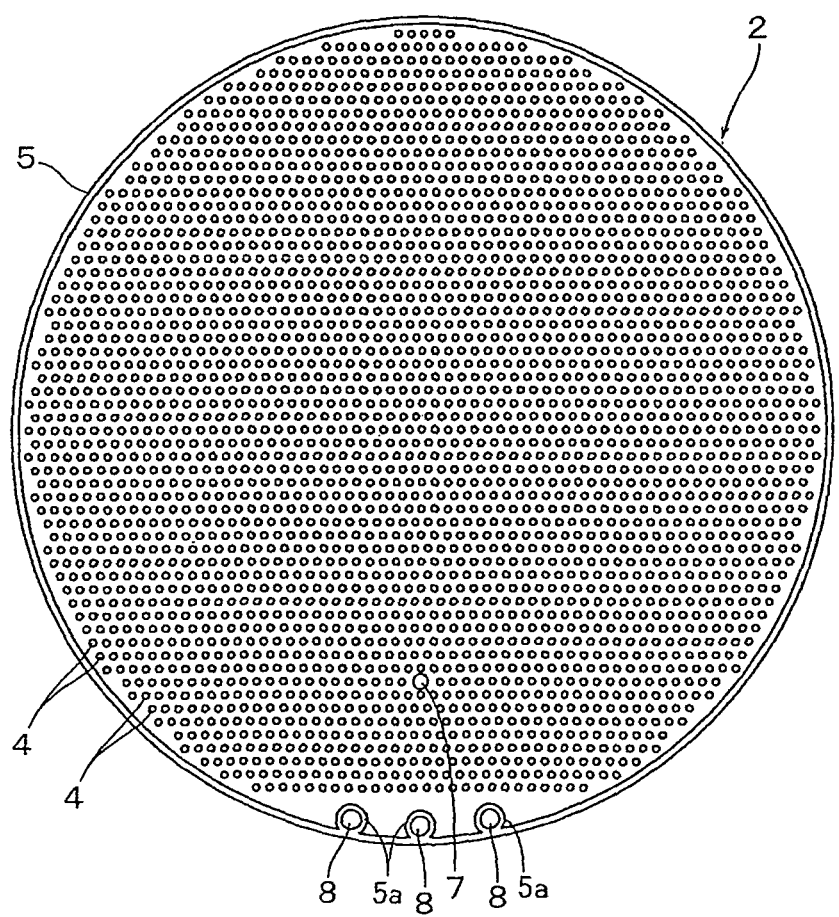
FIG. 2 is a plan view of a jig main body of the fixing jig according to the embodiment of this invention.

With reference to FIGS. 1 and 2, reference numeral 1 denotes a fixing jig for fixing a wafer W which is a thin plate-like work. This fixing jig 1 is made up of a plate-like jig man body 2, and a close contact layer 3 which is disposed on one surface of the jig main body 2.

The jig main body 2 is formed into a circular disc shape which is slightly larger in diameter than the wafer W. The material in which the jig main body 2 is made is not particularly limited as long as it is superior in mechanical strength. The material may, for example, be a metallic material such as an aluminum alloy, magnesium alloy, stainless steel, and the like; a resin forming material such as polyamide, polycarbonate, polypropylene, acrylic resin, polyvinyl chloride, and the like; an inorganic material such as glass; and an organic-inorganic composite material such as glass fiber reinforced epoxy resin, and the like.

On one surface of the jig main body 2 there are formed a plurality of columnar supporting projections 4 of about 0.05~0.5 mm in height and about 0.05~1.0 mm in diameter at a pitch of about 0.2~2.0 mm. Further, on an outer peripheral portion of said one surface of the jig main body 2, there is formed a cylindrical side wall 5 in a height substantially equal to that of the supporting projections 4. The supporting projections 4 may be formed into a shape other than columnar shape, e.g., into truncated conical shape.

The close contact layer 3 is formed of a film of 20~200 µm in thickness made of elastomer of urethane-based, acrylic-based, fluorine-based, silicone-based, and the like, which is superior in flexibility, plasticity, heat resistance, elasticity, adhesiveness, and the like. The close contact layer 3 is adhered to an end surface of the side wall 5 of the jig main body 2 by means of an adhesive, heat sealing and the like. According to this arrangement, there is defined a partitioned space 6 enclosed by the side wall 5 between the close contact layer 3 and the jig main body 2. In addition, the close contact layer 3 is supported by being brought into contact with a flat end surface of each of the supporting projections 4.

The jig main body 2 has formed therein at least one ventilation hole 7 which is in communication with the partitioned space 6 by penetrating through the jig main body 2 in the thickness direction thereof. Further, the jig main body 2 has formed therein at least one suction hole 8 which penetrates through the jig main body 2 in the thickness direction thereof to thereby open into the outside on the side of the close contact layer 3 but which does not come into communication with the partitioned space 6. In this embodiment, in that circumferential one side of the jig main body 2 which lies in a position where a protection sheet S, to be described hereinafter, begins to be peeled off in the processing of peeling the protection sheet S, there are formed, at a circumferential distance from one another, three swelled portions 5a which swell inward of the side wall 5. There are formed a plurality of (three) suction holes 8 so as to open into an end surface of the swelled portions 5a. In addition, the close contact layer 3 has formed therein through holes 9 which are in communication with respective suction holes 8.

With reference to FIG. 3, a description will now be made of the method of processing in which the protection sheet S that has been adhered to the front surface of the wafer W is peeled off after the back grinding step.

Prior to the back grinding step, the protection sheet S is adhered first, to the circuit surface (front surface) of the wafer W in order to protect the circuit formed on the surface of the wafer W. Then, the wafer W is mounted on a back grinding apparatus to thereby perform a grinding processing on the rear surface of the wafer W to a predetermined thickness. The wafer W at this stage has already attained an ultrathin thickness of such a degree that the wafer W will be damaged unless it is moved to the processing table and the like of the subsequent processing apparatus by a special transport apparatus so as not to warp under its own weight and the like. Therefore, the wafer W is not transferred from the processing table on which the back grinding processing was performed, but the close contact layer 3 of the fixing jig 1 is brought into close contact with the rear surface (the ground surface) of the wafer W. According to this arrangement, the wafer W increases in strength and becomes capable of being transported by an ordinary transport apparatus in a manner similar to that before the wafer W is made to be ultrathin.

Figure 3A:
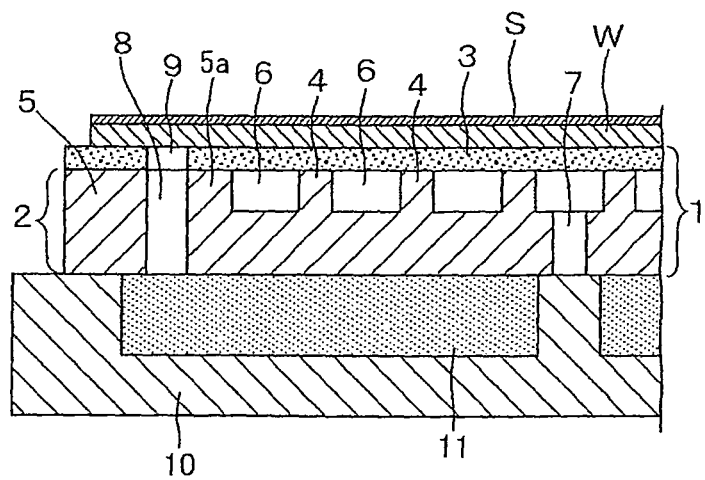
FIGS. 3(a)-3(c) are schematic sectional views showing the working procedures of processing to peel a protection sheet to be performed by using the fixing jig according to this embodiment.

Then there is performed a processing of peeling the protection sheet S that has become unnecessary. The wafer W that is supported by the fixing jig 1 is transferred to a processing table 10 of a sheet peeling apparatus. As a sheet peeling apparatus, reference may be made to the apparatus as described in JP-A-1999-016862. The processing table 10 has a construction as shown in FIG. 3(a). In concrete, the processing table 10 is provided with a suction portion 11 which is of a porous construction and which is slightly smaller in diameter than the fixing jig 1. By evacuating the suction portion 11 with a vacuum pump (not illustrated), the fixing jig 1 is fixed by suction to the processing table 10 on the lower surface which lies opposite to the close contact layer 3. When the wafer W is transferred to the sheet peeling apparatus, alignment is made in advance such that the suction portion 11 of the fixing jig 1 coincides with the peeling origin of the sheet peeling apparatus.

The location in which is disposed the suction hole 8 on the lower surface of the jig main body 2 is positioned on the suction portion 11, but the suction portion is not present in the location in which is disposed the ventilation hole 7 on the lower surface of the jig main body 2. Therefore, when the suction portion 11 is evacuated, only the suction hole 8, out of the ventilation hole 7 and the suction hole 8, is evacuated via the suction portion 11. As a result of evacuation of the suction hole 8, the suction force is partially operated on the wafer W via the through hole 9 in the close contact layer 3.

Figure 3B:
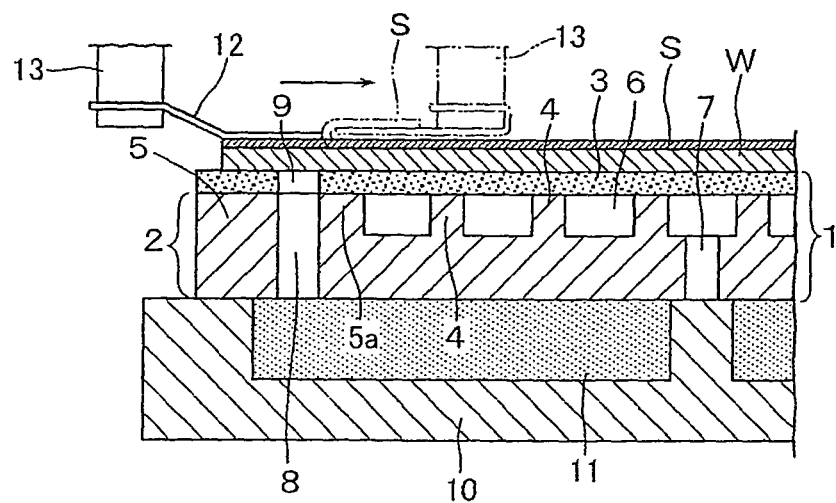

Next, as shown in FIG. 3(b), a peeling tape 12 is adhered to one side portion, as seen in a circumferential direction, of the protection sheet S and this tape 12 is held by a gripping head 13. The gripping head 13 is then relatively moved, as shown by an imaginary line in FIG. 3(b), in relation to the wafer W in that diametrical direction of the wafer W which passes through the portion at which the tape is adhered, thereby peeling the protection sheet S off from the wafer W. At this time, the wafer W is subjected, in addition to the above horizontal force in the diametrical direction, to an upward component of force accompanied by the peeling of the protection sheet S.

Here, since the close contact layer 3 that is formed of the above elastomer has a high shearing close contacting force, it can well withstand the horizontal force to be operated on the wafer W. However, the peeling strength of the close contact layer 3 relative to the wafer W cannot be made so strong for the reasons as described hereinafter. Therefore, the close contact force of the close contact layer 3 alone cannot withstand the upward component of force. As a result, there is a possibility that the wafer W is lifted off from the close contact layer 3 starting with an origin in one circumferential side portion where the peeling is started, whereby the wafer W is tumbled from the fixing jig 1 or the wafer W may be damaged by a bending moment due to an upward component of force.

In this embodiment, on the other hand, since the suction force is partially operated on one side portion as seen in the circumferential direction of the wafer W, it is possible to well withstand the upward component of force by means of this suction force. Therefore, there will be no such disadvantages in that the wafer W is lifted off from the close contact layer 3 so as to be detached from the fixing jig 1 or in that the wafer W is damaged by the bending moment due to an upward component of force.

Figure 3C:
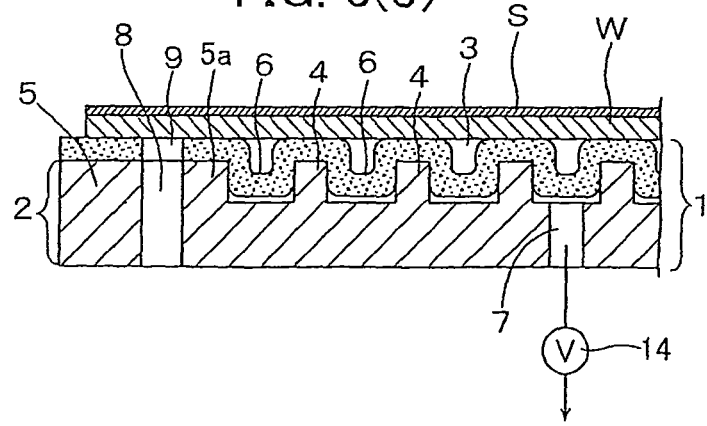

After the processing of peeling the protection sheet S has been finished, the evacuation of the suction portion 11 is stopped, and the fixing jig 1 is tumbled off from the processing table 10. Accordingly, the evacuation of the suction hole 8 is also stopped. Then, as shown in FIG. 3(c), a vacuum pump 14 is connected to the ventilation hole 7 to thereby suck the air within the partitioned space 6 by evacuating the ventilation hole 7. According to this arrangement, the partitioned space 6 is decompressed and, accompanied by this decompression, the close contact layer 3 will be deformed so as to be dented downward at the position between the respective supporting projections 4. As a result, the contact area of the wafer W relative to the close contact layer 3 will be decreased, so that the wafer W can be tumbled from the fixing jig 1 without applying an undue force to the wafer W.

If the peeling strength of the close contact layer 3 relative to the wafer W is increased, the wafer W can be prevented from being lifted off from the close contact layer 3 by the upward component of force accompanied by the peeling of the protection sheet S, even if the suction force via the suction hole 8 is not operated on the wafer W. However, even if the partitioned space 6 is reduced in pressure, the close contact force relative to the wafer W will be too strong and, therefore, deformation of the close contact layer 3 will be hard to take place. As a result, at the time when the wafer W is removed from the fixing jig 1, undue force will be operated on the wafer W, so that the wafer W is likely to be damaged. On the other hand, according to this embodiment, the suction force by the suction hole 8 is partially operated on the wafer W at the time of processing of peeling the protection sheet S. Therefore, there is no need of increasing so much the peeling strength of the close contact layer 3 relative to the wafer W. Consequently, the close contact layer 3 will surely be deformed by the evacuation of the partitioned space 6, giving rise to no disadvantages as described above.

A description has so far been made of an embodiment in which this invention is applied to the fixing jig 1 to be used in the processing in which the protection sheet S is peeled off from the wafer W. This invention can also be applied to the fixing jig which is used in the processing of wafers W other than for processing of peeling the protection sheet S, or be applied to the fixing jig which is used in the processing of a thin plate-like work other than a wafer W such as a precision substrate made of quartz glass and the like.

In addition, in the above embodiment, there was formed a suction hole 8 on one circumferential side portion of the outer circumference of the jig main body 2. The position of forming the suction hole 8 is, however, not limited to the above example. For example, in case suction of the work becomes necessary in the central portion of the fixing jig 1, the following arrangement may be employed, i.e., the supporting projections 4 located in the central portion are formed in larger diameter, and the suction hole may be formed so as to be opened into an end surface of the supporting projections 4.

What is claimed is:

1. A fixing jig for fixing a thin plate-shaped work, the fixing jig comprising:
   a plate-shaped jig main body; and
   a close contact layer which is disposed on one surface of the plate-shaped jig main body and which detachably holds the thin plate-shaped work in close contact with the plate-shaped jig main body,
   wherein the plate-shaped jig main body has: a plurality of supporting projections on one surface thereof for supporting the close contact layer; and a side wall of a height which is substantially equal to the supporting projections, the side wall being disposed along an outer peripheral portion of said one surface, the close contact layer being adhered to an end surface of the side wall so as to define, between the close contact layer and the plate-shaped jig main body, a partitioned space enclosed by the side wall,
   wherein the plate-shaped jig main body has formed therein:
   a ventilation hole which is in communication with the partitioned space such that the close contact layer is deformed by suction of the air within the partitioned space via the ventilation hole;
   a swelled portion which swells inward of the side wall at a circumferential one side of the plate-shaped jig main body; and
   a suction hole which opens into an outside surface on a side of the close contact layer at the swelled portion but which is free from communication with the partitioned space,
   wherein the close contact layer has formed therein a through hole which is in communication with the suction hole, the through hole being so constructed and arranged that, by evacuation of the suction hole, a suction force is operated on the thin plate-shaped work.

2. A method of processing a work by using a fixing jig for fixing a thin plate-shaped work, the method comprising the steps of:
   providing a plate-shaped jig main body and a close contact layer, the plate-shaped jig main body including:
   a side wall;
   a partitioned space enclosed by the side wall; and
   a swelled portion which swells inward of the side wall at a circumferential one side of the plate-shaped jig main body;
   performing a predetermined processing on the work in a state in which the thin plate-shaped work is held in close contact with the close contact layer of the fixing jig,
   forming a ventilation hole and a suction hole in the plate-shaped jig main body;
   keeping the ventilation hole free from evacuation but in which the suction hole is evacuated; and removing the thin plate-shaped work from the fixing jig by stopping the evacuation of the suction hole and by sucking the air within the portioned space through evacuation of the ventilation hole so as to deform the close contact layer, wherein the suction hole opens into an outside surface on a side of the close contact layer at the swelled portion but which is free from communication with the partitioned space, and the close contact layer has formed therein a through hole which is in communication with the suction hole the through hole being so constructed and arranged that, by evacuation of the suction hole, a suction force is operated on the thin plate-shaped work.

* * * * *